United States Patent [19]

Endou et al.

[11] Patent Number: 4,492,681
[45] Date of Patent: Jan. 8, 1985

[54] METHOD FOR THE PREPARATION OF SILICON CARBIDE FIBERS

[75] Inventors: Morinobu Endou, Nagano; Minoru Takamizawa, Tokyo; Tatsuhiko Hongu, Kanagawa; Taishi Kobayashi, Niigata, all of Japan

[73] Assignee: Shin-Etsu Chemical Co., Ltd., Tokyo, Japan

[21] Appl. No.: 505,250

[22] Filed: Jun. 17, 1983

[30] Foreign Application Priority Data

Jun. 30, 1982 [JP] Japan ................. 57-113689

[51] Int. Cl.³ .............................................. C01B 31/36
[52] U.S. Cl. .................................................. 423/345
[58] Field of Search ................... 423/345, 346

[56] References Cited

U.S. PATENT DOCUMENTS 3,493,402  2/1970  Niebylski ..................... 423/346 X
4,013,503  3/1977  Knippenberg et al. ........ 423/346 X

*Primary Examiner*—G. L. Kaplan

[57] ABSTRACT

The invention provides a novel method for the preparation of silicon carbide fibers capable of being performed at a relatively low temperature and giving fibers of relatively large lengths by the vapor-phase pyrolysis of an organosilicon compound on a substrate. The method comprises contacting an organosilicon compound, which should have no halogen and oxygen atoms directly bonded to the silicon atoms and have preferably at least one hydrogen atom directly bonded to the silicon atom in a molecule, with a finely divided powder of a metal or a compound of a metal, such as copper, silver, vanadium, niobium, tantalum, iron, cobalt, nickel, palladium and platinum, at a temperature of 700° to 1450° C. so that the powder serves simultaneously as a catalyst and nucleus for the growth of the silicon carbide fibers thereon formed by the pyrolysis of the organosilicon compound. When the organosilicon compound is deficient of the carbon content relative to the silicon so that free silicon may be formed by the pyrolysis, admixing of a hydrocarbon to the feed of the organosilicon compound can solve the problem.

11 Claims, 1 Drawing Figure

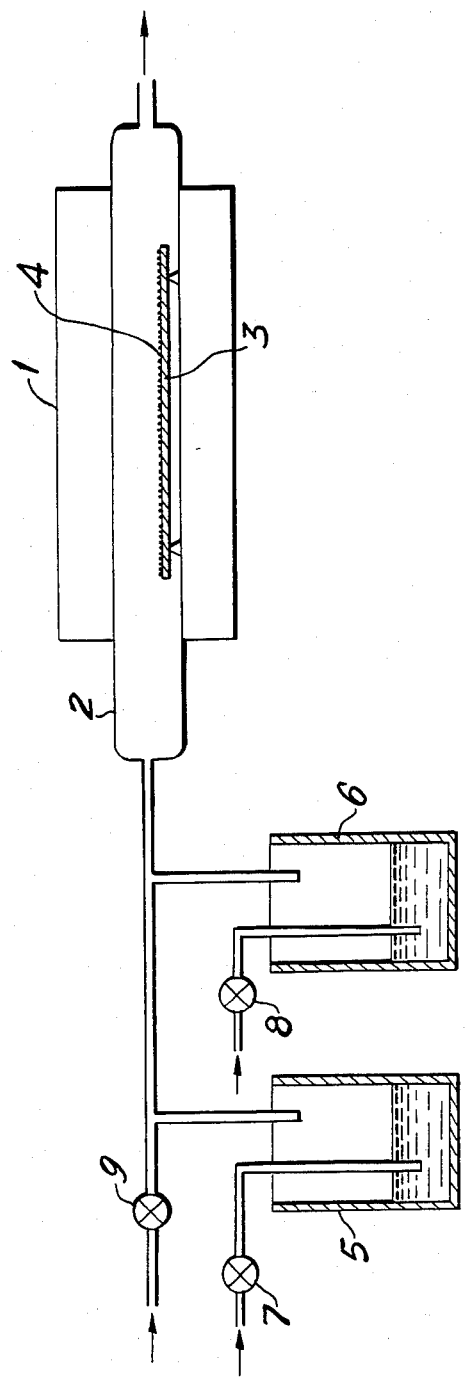

METHOD FOR THE PREPARATION OF SILICON CARBIDE FIBERS

BACKGROUND OF THE INVENTION

The present invention relates to a method for the preparation of silicon carbide fibers or, more particularly, to a method for the preparation of silicon carbide fibers by the vapor-phase pyrolysis of an organosilicon compound on a substrate surface.

As is known, silicon carbide fibers, i.e. a fibrous material mainly composed of silicon carbide SiC, are very promising as a material used in high-performance composites with various kinds of metals, ceramics and organic resins by virtue of the outstandingly high heat resistance and oxidation resistance as well as excellent mechanical strengths. Accordingly, several methods have been proposed in the prior art for the preparation of silicon carbide fibers.

Conventional methods for the preparation of silicon carbide fibers are typically classified into three classes. First of the classes is the so-called CVD (chemical vapor deposition) method in which a gaseous mixture composed of a gaseous halogen-containing silicon compound such as silicon tetrachloride $SiCl_4$, trichlorosilane $HSiCl_3$ and organochlorosilanes represented by the general formula $R_nSiCl_{4-n}$, in which R is a monovalent hydrocarbon group and n is an integer of 1, 2 or 3, and a gaseous hydrocarbon compound such as methane, ethane and the like is pyrolyzed at a high temperature so that the silicon carbide as the reaction product is deposited on the surface of a substrate in the form of whiskers.

The method belonging to the second class of the methods for the preparation of silicon carbide fibers comprises spinning of a polycarbosilane, i.e. an organosilicon polymer composed of a backbone structure of recurring carbon-to-silicon linkages, into filaments followed by firing of them at a high temperature to be converted into long filaments of silicon carbide (see, for example, Japanese Patent Kokai No. 52-70122).

The third class of the methods involves vapor-phase pyrolyzing deposition of free silicon on the surface of carbon fibers followed by firing of the thus silicon-clad carbon fibers at 1400° to 2600° C. to effect the reaction between the carbon and silicon to form silicon carbide in the form of fibers (see, for example, Japanese Patent Kokai No. 50-38700).

These prior art methods have their own respective disadvantages accompanying the advantages and none of the conventional methods is quite satisfactory in one or other respects. For example, the first class method is disadvantageous because the silicon carbide fibers obtained in this CVD method are always whisker-like with limited fiber lengths so that the reinforcing effect obtained in a composite material with such whisker-like silicon carbide fibers is sometimes insufficient even though the reaction temperature of pyrolysis in the range of 1300° to 1500° C. is not excessively high.

The second class method of firing of polycarbosilane filaments is suitable when long filaments of silicon carbide are desired. This method is defective, however, because the method is performed in a very complicated and lengthy process including synthesis of the polycarbosilane polymer as the starting material, spinning of the polymer into filaments and firing of the filaments at high temperatures so that the cost for the preparation of the silicon carbide fibers is necessarily very high.

The third class method is performed in two steps of first depositing silicon on the carbon fibers and then reacting the silicon and carbon by firing the silicon-clad carbon fibers at a temperature of 1400° to 2600° C. so that this method is also disadvantageous in the high production cost as a result of the complicated process involving high temperature treatment.

SUMMARY OF THE INVENTION

An object of the present invention is therefore to provide a novel and improved method for the preparation of silicon carbide fibers freed from the above described disadvantages and problems in the prior art methods. The principle of the inventive method is a modification of the CVD method but, different from conventional CVD methods, the method of the invention can be performed at a much lower temperature than in the conventional methods and the lengths of the silicon carbide fibers obtained in the inventive method are large enough to ensure sufficient reinforcing effect when they are incorporated into a composite material.

Thus, the method of the present invention for the preparation of silicon carbide fibers comprises pyrolyzing a gaseous organosilicon compound having no halogen atoms and oxygen atoms directly bonded to the silicon atom or atoms at an elevated temperature in contact with a fine powder of a metal or a metal compound which serves as a catalyst and simultaneously as a nucleus for the growth of silicon carbide fibers. The organosilicon compound as the starting material should preferably have at least one hydrogen atom directly bonded to the silicon atom in a molecule and the metal as the catalytic nucleus is preferably selected from those belonging to the Ib, Va and VIII groups of the Periodic Table so that the reaction of pyrolysis may be performed at a relatively low temperature of 700° to 1450° C. It has been further discovered that, when the organosilicon compound has too many hydrogen atoms directly bonded to the silicon atom or atoms resulting in the formation of free silicon as a pyrolysis product, the defect can be remedied by admixing the organosilicon compound with a hydrocarbon compound.

BRIEF DESCRIPTION OF THE DRAWING

The FIGURE is a schematic illustration of an apparatus used in the inventive method for the preparation of silicon carbide fibers suitable when the starting materials are liquid.

DETAILED DESCRIPTION OF THE PREFERRED EMBODIMENTS

As is mentioned above, the method of the present invention is a modification of the CVD method and has been established as a result of the extensive investigations undertaken by the inventors with a prospect that the CVD method is the most suitable for the industrial production of silicon carbide fibers so that feasibility may be found in the method provided that improvements be obtained in respect of decreasing the pyrolysis temperature and producing fibers of larger lengths.

The starting material used in the above summarized method of the present invention is a gaseous organosilicon compound having no halogen and oxygen atoms directly bonded to the silicon atom or atoms. Examples of such an organosilicon compound suitable for the method include, for example, an organosilane or organopolysilane compound typically represented by the general formula $R_{2n+2}Si_n$, in which R is a hydrogen atom or a monovalent hydrocarbon group selected from the class consisting of methyl, ethyl, propyl, phenyl and vinyl groups and n is a positive integer not exceeding 4 or, preferably, 3, at least one of the groups denoted by R in a molecule being necessarily a monovalent hydrocarbon group, and an organosilicon compound having a silhydrocarbylene linkage or an organosilicon compound having simultaneously a polysilane linkage and a silhydrocarbylene linkage in a molecule as represented by the general formula $R_3Si(-R^1-SiR_2)_{\overline{m}}R$, in which R has the same meaning as defined above, $R^1$ is a hydrocarbylene, i.e. divalent hydrocarbon, group selected from the class consisting of methylene, ethylene and phenylene groups and m is 1 or 2. It is preferable that the organosilicon compound as the starting material in the inventive method has at least one hydrogen atom directly bonded to the silicon atom in a molecule.

Several of the examples in conformity with the above definition of the compound include, denoting methyl, ethyl, propyl, phenyl and vinyl groups by the symbols Me, Et, Pr, Ph and Vi, respectively, methylsilane MeSiH$_3$, dimethylsilane Me$_2$SiH$_2$, trimethylsilane Me$_3$SiH, diethylsilane Et$_2$SiH$_2$, propylsilane PrSiH$_3$, phenylsilane PhSiH$_3$, vinyl methylsilane Vi.MeSiH$_2$, 1,2-dimethyl disilane MeH$_2$Si—SiMeH$_2$, 1,1,2,2-tetramethyl disilane Me$_2$HSi—SiMe$_2$H, 1,1,2,3,3-pentamethyltrisilane Me$_2$HSi—SiMeH—SiMe$_2$H, bis(dimethylsilyl) methane Me$_2$HSi—CH$_2$—SiMe$_2$H, bis(dimethylsilylmethyl) dimethyl silane Me$_2$HSi—CH$_2$—SiMe$_2$—CH$_2$—SiMe$_2$H, 1,2-bis(dimethylsilyl) ethane Me$_2$HSi—CH$_2$—CH$_2$—SiMe$_2$H, 4-(dimethylsilyl)-phenyl dimethylsilane Me$_2$HSi—C$_6$H$_4$—SiMe$_2$H and 1-dimethylsilylmethyl-1,1,2,2-tetramethyldisilane Me$_2$HSi—CH$_2$—SiMe$_2$—SiMe$_2$H. These compounds may be used either singly or as a combination of two kinds or more according to need. Particularly suitable is a mixture of methyl hydrogensilanes mainly composed of dimethylsilane obtained by the pyrolysis of a dimethylpolysilane having a recurring structure of the monomeric unit —SiMe$_2$— at a temperature of 350° C. or higher as disclosed in Japanese Patent Kokai No. 58-65298.

The catalyst used in the method of the present invention is a finely divided powder of a metal or metal compound, which also serves as the nuclei for the growth of the silicon carbide fibers. The kind of the metal is not particularly limitative but preferably selected from the class consisting of the metals belonging to the Ib, Va and VIII groups of the Periodic Table including copper, silver, vanadium, niobium, tantalum, iron, cobalt, nickel, palladium and platinum in view of the relatively high catalytic activity for the formation of silicon carbide by the pyrolysis of the organosilicon compound. When a compound of the metal is used as the catalytic nucleus, the compound should preferably be susceptible to conversion into the corresponding metal form by the thermal decomposition, in particular, in a reducing atmosphere. In this regard, oxides, carbides, salts and organic compounds of the above named metals are suitable. This fact suggests that the effective catalytic species is the metal and not the metal compound per se.

The catalyst powder should be divided as finely as possible and the average particle diameter of the catalyst powder should be 10 μm or less or, preferably, 5 μm or less. The catalyst powder may be placed in the reaction zone of the reactor in any desired manner but it is a convenient way from the standpoint of easiness in the recovery of the silicon carbide fibers formed by the reaction that the catalyst powder is spread and deposited on a substrate plate made of, for example, porcelain, sintered alumina, silicon nitride, carbon and the like refractory materials, for example, by drying the substrate plate coated with a liquid dispersion containing the metal powder and the substrate plate bearing the catalyst powder is put into the reaction zone of the reactor so that the silicon carbide fibers grow up on the substrate plate starting from the particles of the catalyst powder.

The method of the present invention is performed by introducing the gaseous organosilicon compound as named above into a reactor in a furnace such as a tubular furnace kept at a prescribed temperature and containing the catalyst powder therein, preferably, as borne on a substrate plate so that the organosilicon compound is pyrolyzed in the gaseous phase to form silicon carbide which grows in a fibrous form on the particles of the catalyst powder. The temperature at which the pyrolysis reaction is performed should be in the range from 700° to 1450° C. or, preferably, from 1000° to 1250° C. because the growth of the silicon carbide fiber is too tedious at 700° C. or below while the silicon carbide fibers grown at 1450° C. or higher may have an undesirably large diameter. Even when the temperature of the reaction exceeds the melting point of the metal catalyst, the effectiveness of the inventive method is not reduced provided that a suitable measure is undertaken to ensure the finely dispersed state of the catalyst powder such as the use of a refractory substrate plate on which the catalyst particles are deposited in dispersion. It is preferable that the gaseous organosilicon compound is introduced into the reactor as diluted with a carrier gas such as hydrogen or an inert gas, e.g. nitrogen, helium and argon, in order to increase the efficiency of pyrolysis.

It is noted that, in some cases, free silicon is formed and contained in the silicon carbide to cause decrease in the physical properties of the desired silicon carbide fibers depending on the reaction conditions, in particular, when the starting organosilicon compound has a relatively large number of silicon-bonded hydrogen atoms in a molecule or, in other words, the ratio of the number of carbon atoms to the silicon atoms in the organosilicon compound is relatively small, as in methylsilane, dimethylsilane and 1,2-dimethyl disilane. Such a disadvantage can be avoided when the starting organosilicon compound is admixed with a gaseous hydrocarbon compound which may be saturated or unsaturated or aliphatic or aromatic exemplified by methane, ethane, ethylene, propylene, acetylene, benzene, toluene and the like. The amount of the hydrocarbon compound should be limited to equimolar or smaller relative to the organosilicon compound since an excessively large amount of the hydrocarbon may eventually cause formation of free carbon. In this method of the combined use of a hydrocarbon compound in the gaseous feed, the silicon constituent in the starting organosilicon compound is fully utilized and converted into silicon carbide so that formation of free silicon can be minimized not to cause decrease in the physical properties of the desired silicon carbide fibers.

In summary, the principle of the inventive method consists in the catalytic pyrolysis of a specific organosilicon compound in a gaseous form on a specific catalyst which may be a powder of a metal or metal compound simultaneously serving as the nuclei for the growth of the silicon carbide fibers as the desired product. This method is advantageous because the reaction of pyrolysis can proceed sufficiently rapidly at a relatively low temperature and fine silicon carbide fibers having a relatively large fiber length can be obtained easily and reproducibly. The silicon carbide fibers obtained by the inventive method are useful as a reinforcing material in high-performance composite materials as combined with other metals, ceramics, synthetic resins and the like matrix materials.

In the following, the method of the present invention is described in further detail by way of examples, in which the symbol Me denotes a methyl group as in the above.

EXAMPLE 1

(Experiment No. 1)

A plate of sintered alumina ceramic having dimensions of 30 mm width, 200 mm length and 3 mm thickness was uniformly coated with 5 ml of an ethanolic dispersion prepared by dispersing 10 mg of fine iron powder having a particle diameter of 10 to 20 nm in 100 ml of ethyl alcohol followed by drying. Into a quartz glass-made core tube 2 of 50 mm inner diameter and 1000 mm length horizontally held in an electric tubular furnace 1 illustrated in the accompanying drawing was placed the above prepared alumina substrate plate 3 bearing the deposition of the iron powder 4.

When the temperature of the substrate plate had reached and was kept at 1150° C., a feed gas containing vapor of 1,1,2,2-tetramethyl disilane obtained by bubbling hydrogen gas at a rate of 130 ml/minute into liquid tetramethyl disilane kept at 4° C. in the vessel 5 through the valve 7 was introduced into the reactor tube 2 with the valves 8 and 9 closed. After 1 hour of continuous introduction of the feed gas as described above, the power supply to the electric furnace was turned off and helium gas was introduced by opening the valve 9 instead of the disilane-containing feed gas interrupted by closing the valve 7.

The substrate plate taken out of the furnace after cooling was found to be covered with a black fibrous material of somewhat yellowish green tint. Measurement of this product indicated that the fibers had a length of 5 to 8 mm and the average fiber diameter was about 12 μm. X-ray diffractometric analysis of the fibers indicated that the fibers were formed of β-type silicon carbide.

EXAMPLE 2

(Experiments No. 2 to No. 18)

The experimental procedure was substantially the same as in Example 1 except that the kinds of the catalyst and the starting organosilicon compound and the reaction temperature were as indicated in Table 1 below. The particle diameter of each of the metal catalysts was 10 to 30 nm. When iron oxalate was used as the catalyst, the substrate plate was coated with 5 ml of a 0.1% aqueous solution of iron oxalate followed by drying. The Experiments No. 16 to No. 18 were undertaken for comparative purpose each by use of a chlorosilane, i.e. methyl trichlorosilane, methyl dichlorosilane or dimethyl dichlorosilane, respectively, as the starting organosilicon compound. When the starting silicon compound was gaseous, the vessel 5 was replaced with a gas cylinder of the silicon compound and the hydrogen carrier gas was introduced through the valve 9.

In each of the Experiments No. 2 to No. 15, the reaction product was the desired silicon carbide in the fibrous form having an average fiber diameter and fiber length as indicated in the table although small amounts of undesired by-products were found in some of the experiments as shown in the footnotes to the table. The yield of the silicon carbide fibers was 0.5 to 10 g in each of the experiments.

TABLE 1

| Experiment No. | Catalyst | Organosilicon compound | Reaction temperature, °C. | Fiber diameter, μm | Fiber length, mm |
| --- | --- | --- | --- | --- | --- |
| 2 | Fe | HMe$_2$Si—SiMe$_2$H | 1180 | 18 | 8 |
| 3 | Fe—Ni | " | 1150 | 11 | 12 |
| 4 | Cu | " | 1110 | 10 | 15 |
| 5 | Pt | " | 1150 | 12 | 6 |
| 6 | V | " | 1180 | 20 | 5 |
| 7*[1] | Fe—Ni | " | 1210 | 25 | 7 |
| 8*[2] | Cu | " | 1080 | 9 | 20 |
| 9 | Iron oxalate | " | 1080 | 8 | 25 |
| 10 | Fe—Ni | HMe$_2$Si—SiMe$_2$—SiMe$_2$H | 1150 | 16 | 13 |
| 11*[3] | Fe | H$_2$SiMe$_2$ | 1050 | 10 | 16 |
| 12*[3] | Fe | H$_3$SiMe | 1030 | 8 | 18 |
| 13 | Fe—Ni | HMe$_2$SiCH$_2$SiMe$_2$H | 1200 | 20 | 8 |
| 14*[4] | Cu | HMe$_2$SiC$_6$H$_4$SiMe$_2$H | 1180 | 17 | 12 |
| 15*[2] | Pt | H$_2$SiMe$_2$ | 980 | 7 | 15 |
| 16*[5] | Fe | MeSiCl$_3$ | 1150 | — | — |
| 17*[6] | Fe | MeHSiCl$_2$ | 1150 | — | — |
| 18*[6] | Fe | Me$_2$SiCl$_2$ | 1150 | — | — |

Note.
*[1]Fine black powder was formed along with fibers.
*[2]A very small amount of free silicon was contained in the fibers.
*[3]Free silicon was contained in the fibers.
*[4]A small amount of free carbon was contained in the fibers.
*[5]No reaction product was obtained.
*[6]Black solid protrusions were formed in a very small amount.

On the other hand, no fibrous products were obtained in the comparative experiments No. 16 to No. 18. It was noted that free silicon was formed more or less in Experiments Nos. 8, 11, 12 and 15.

EXAMPLE 3

(Experiments No. 19 to No. 23)

The experiments in this example were undertaken with an object to solve the problem of free silicon formation which took place in some of the experiments in the preceding example. Thus, along with the supply of the feed gas containing the organosilicon compound carried by hydrogen gas in the same manner as in the preceding examples, a hydrocarbon gas was added to the feed gas. When the hydrocarbon was methane or ethylene, the hydrocarbon gas diluted with hydrogen was introduced into the reactor tube 2 from the valve 8 through the empty vessel 6. When benzene was used as the hydrocarbon, hydrogen gas was bubbled through the valve 8 into the benzene contained in the vessel 6 and the benzene-carrying hydrogen gas was combined with the feed gas coming from the vessel 5 carrying the organosilicon compound. The molar mixing ratio in each of the experiments was as shown in Table 2 which summarizes the kinds of the catalyst, organosilicon compound and hydrocarbon and the reaction temperature as well as the average fiber diameter and fiber length obtained in the experiments. As is shown in the table and footnote, no free silicon was formed in each of the experiments and the results were quite satisfactory with only one exception of Experiment No. 22 in which a very small amount of free carbon was found in the silicon carbide fibers as the product.

TABLE 2

| Experiment No. | Catalyst | Organosilicon compound | Hydrocarbon | Molar ratio | Reaction temperature, °C. | Fiber diameter, $\mu$m | Fiber length, mm |
| --- | --- | --- | --- | --- | --- | --- | --- |
| 19 | Fe | $H_2SiMe_2$ | Methane | 1:1 | 1050 | 9 | 18 |
| 20 | Fe | " | Benzene | 9:1 | 1050 | 12 | 22 |
| 21 | Fe | $H_3SiMe$ | Benzene | 8:2 | 1030 | 10 | 15 |
| 22*[7] | Cu | $HMe_2Si—SiMe_2H$ | Benzene | 9:1 | 1080 | 8 | 17 |
| 23 | Pt | $H_2SiMe_2$ | Ethylene | 3:1 | 980 | 9 | 13 |

Note.
*[7] A very small amount of free carbon was bound to the silicon carbide fibers.

What is claimed is:

1. A method for the preparation of silicon carbide fibers by the pyrolysis of an organosilicon compound on a substrate at an elevated temperature which comprises contacting a feed gas containing an organosilicon compound having at least one hydrogen atom and no halogen and oxygen atoms directly bonded to the silicon atoms at an elevated temperature with a finely divided powder of a metal or a compound of the metal to effect pyrolysis of the organosilicon compound.

2. The method as claimed in claim 1 wherein the elevated temperature is in the range from 700° to 1450° C.

3. The method as claimed in claim 1 wherein the metal is selected from the class consisting of the metals belonging to the Ib, Va and VIII groups of the Periodic Table.

4. The method as claimed in claim 3 wherein the metal belonging to the Ib group of the Periodic Table is copper or silver.

5. The method as claimed in claim 3 wherein the metal belonging to the Va group of the Periodic Table is selected from the class consisting of vanadium, niobium and tantalum.

6. The method as claimed in claim 3 wherein the metal belonging to the VIII group of the Periodic Table is selected from the class consisting of iron, cobalt, nickel, palladium and platinum.

7. The method as claimed in claim 1 wherein the feed gas is a mixture of the organosilicon compound and a hydrocarbon compound in an equimolar amount to the organosilicon compound or smaller.

8. The method as claimed in claim 1 wherein the finely divided powder has a particle diameter not exceeding 5 $\mu$m.

9. The method as claimed in claim 1 wherein the finely divided powder is spread and deposited on a substrate plate of a refractory material.

10. The method as claimed in claim 1 wherein the feed gas is diluted with hydrogen gas.

11. The method as claimed in claim 1 wherein the compound of the metal is selected from the class consisting of oxides, carbides, salts and organic compounds of the metal.

* * * * *